United States Patent
Cao (10) Patent No.: US 10,224,382 B2
(45) Date of Patent: Mar. 5, 2019

(54) METHOD FOR MANUFACTURING AN OLED DISPLAY SCREEN INTEGRATED WITH TOUCH FUNCTION

(71) Applicant: WUHAN CHINA STAR OPTOELECTRONICS SEMICONDUCTOR DISPLAY TECHNOLOGY CO., LTD., Wuhan, Hubei (CN)

(72) Inventor: Xuwen Cao, Hubei (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 0 days.

(21) Appl. No.: 15/568,806

(22) PCT Filed: Sep. 4, 2017

(86) PCT No.: PCT/CN2017/100343
§ 371 (c)(1),
(2) Date: Oct. 24, 2017

(65) Prior Publication Data
US 2019/0035857 A1 Jan. 31, 2019

(51) Int. Cl.
H04L 21/00 (2006.01)
H01L 27/32 (2006.01)
H01L 51/52 (2006.01)

(52) U.S. Cl.
CPC ........ *H01L 27/323* (2013.01); *H01L 27/3276* (2013.01); *H01L 51/5253* (2013.01); *H01L 2227/323* (2013.01)

(58) Field of Classification Search
CPC ............... H01L 27/323; H01L 51/5253; H01L 27/3276
See application file for complete search history.

(56) References Cited

U.S. PATENT DOCUMENTS 8,120,030 B2 * 2/2012 Godo ................ H01L 29/78696
257/57
8,158,975 B2 * 4/2012 Akimoto ............. H01L 29/7869
257/43
8,218,099 B2 * 7/2012 Yamazaki ........... H01L 27/1225
349/43

* cited by examiner

*Primary Examiner* — Richard A Booth
(74) *Attorney, Agent, or Firm* — Mark M. Friedman (57) ABSTRACT

A method for manufacturing an OLED display screen integrated with a touch function is provided, which includes steps of providing a glass substrate, forming an insulating layer and a wiring circuit layer, forming an OLED light-emitting layer, forming a first insulating ceramic layer, forming a first insulating organic layer, forming a first touch electrode layer, forming a touch insulating ceramic layer, forming a wire through hole in the wiring region of the glass substrate, forming a second touch electrode layer; and forming a wire in the wiring region of the glass substrate, wherein the wire is to the wiring circuit layer through the wiring through hole.

18 Claims, 4 Drawing Sheets

METHOD FOR MANUFACTURING AN OLED DISPLAY SCREEN INTEGRATED WITH TOUCH FUNCTION

FIELD OF THE INVENTION

The present disclosure relates to the field of display panels, and more particularly to a method for manufacturing an OLED display screen integrated with a touch function.

BACKGROUND OF THE DISCLOSURE

With the development of science and technology, people have higher requirements for displays. For instance, the user finds it is desirable to add a touch function to the displays.

For conventional touch displays, and particularly OLED displays integrated with a touch function, a flexible touch screen is added onto the active-matrix organic light emitting diode (AMOLED), and a protective cover is attached onto the flexible touch screen. This add-on AMOLED is encapsulated by two to three layers of ceramic and organic films, and has effective waterproof and antioxidation. However, since the touch portion and the display portion of the display are manufactured separately, the manufacturing cost of the touch display is high, and the manufacturing process is complicated.

SUMMARY OF THE INVENTION

An object of the present disclosure to provide a method for manufacturing an OLED display screen integrated with a touch function, which has a relatively low manufacturing cost and a relatively simple manufacturing process, for resolving the technical problems of the high manufacturing cost and the complicated manufacturing process of the conventional OLED display screen integrated with a touch function.

An embodiment of the present disclosure provides a method for manufacturing an OLED display screen integrated with a touch function, comprising steps of:

providing a glass substrate including a pixel region and a wiring region;

forming an insulating layer on the glass substrate;

forming a driving circuit layer in the pixel region and a wiring circuit layer in the wiring region on the glass substrate;

forming an OLED light-emitting layer in the pixel region of the glass substrate;

forming a first insulating ceramic layer on the glass substrate;

forming a first insulating organic layer in the pixel region of the glass substrate;

forming a first touch electrode layer in the pixel region of the glass substrate;

forming a touch insulating ceramic layer on the glass substrate, and forming a wiring through hole in the wiring region of the glass substrate;

forming a second touch electrode layer in the pixel region of the glass substrate, and forming a wire in the wiring region of the glass substrate, wherein the wire is connected to the wiring circuit layer through the wiring through hole; and forming a touch electrode protective layer on the second touch electrode layer;

wherein the first touch electrode layer is a touch sensing layer, the second touch electrode layer is a touch driving layer, and the touch sensing layer and the touch driving layer are insulated against each other by the touch insulating ceramic layer.

In the method for manufacturing the OLED display screen integrated with the touch function in the present disclosure, the step of forming the first insulating ceramic layer on the glass substrate comprises steps of:

depositing a first insulating ceramic layer material on the glass substrate;

etching the first insulating ceramic layer material in the pixel region of the glass substrate to form the first insulating ceramic layer;

wherein the step of forming the first insulating organic layer in the pixel region of the glass substrate comprises steps of:

depositing a first insulating organic layer material on the pixel region of the glass substrate; and etching the first insulating organic layer material on the pixel region of the glass substrate to form the first insulating organic layer.

In the method for manufacturing the OLED display screen integrated with the touch function in the present disclosure, the steps of forming the touch insulating ceramic layer on the glass substrate and forming the wiring through hole in the wiring region of the glass substrate comprise steps of:

depositing a touch insulating ceramic layer material on the glass substrate; and etching the touch insulating ceramic layer material in the pixel region of the glass substrate to form the touch insulating ceramic layer; and etching the first insulating ceramic layer material and the touch insulating ceramic layer material in the wiring region of the glass substrate, to form the wiring through hole.

In the method for manufacturing the OLED display screen integrated with the touch function in the present disclosure, a dry etching is performed on the first insulating ceramic layer material and the touch insulating ceramic layer material, to form the wiring through hole.

In the method for manufacturing the OLED display screen integrated with the touch function in the present disclosure, after the step of forming the first insulating organic layer in the pixel region of the glass substrate, and before the step of forming the first touch electrode layer in the pixel region of the glass substrate, the method further comprising steps of:

forming a second insulating ceramic layer on the glass substrate; and forming a second insulating organic layer in the pixel region of the glass substrate.

In the method for manufacturing the OLED display screen integrated with the touch function, the step of forming the first insulating ceramic layer on the glass substrate, comprises:

the step of forming a second insulating ceramic layer on the glass substrate, comprises steps of:

depositing a second insulating ceramic layer material on the glass substrate;

etching the second insulating ceramic layer material in the pixel region of the glass substrate to form the second insulating ceramic layer;

wherein the step of forming the second insulating organic layer in the pixel region of the glass substrate comprises steps of:

depositing a second insulating organic layer material in the pixel region of the glass substrate; and etching the second insulating organic layer material in the pixel region of the glass substrate, to form the second insulating organic layer.

In the method for manufacturing the OLED display screen integrated with the touch function, the steps of forming the touch insulating ceramic layer on the glass substrate and forming the wiring through hole in the wiring region of the glass substrate comprise steps of:

depositing a touch insulating ceramic layer material on the glass substrate; and etching the touch insulating ceramic layer material in the pixel region of the glass substrate to form the touch insulating ceramic layer; and etching the first insulating ceramic layer material, the second insulating ceramic layer material, and the touch insulating ceramic layer material in the wiring region of the glass substrate to form the wiring through hole.

In the method for manufacturing the OLED display screen integrated with the touch function in the present disclosure, a dry etching is performed on the first insulating ceramic layer material, the second insulating ceramic layer material, and the touch insulating ceramic layer material to form the wiring through hole.

An embodiment of the present disclosure provides a method for manufacturing an OLED display screen integrated with a touch function, comprising steps of:

providing a glass substrate including a pixel region and a wiring region;

forming an insulating layer on the glass substrate;

forming a driving circuit layer in the pixel region and a wiring circuit layer in the wiring region on the glass substrate;

forming an OLED light-emitting layer in the pixel region of the glass substrate;

forming a first insulating ceramic layer on the glass substrate;

forming a first insulating organic layer in the pixel region of the glass substrate;

forming a first touch electrode layer in the pixel region of the glass substrate;

forming a touch insulating ceramic layer on the glass substrate, and forming a wiring through hole in the wiring region of the glass substrate; and forming a second touch electrode layer in the pixel region of the glass substrate, and forming a wire in the wiring region of the glass substrate, wherein the wire is connected to the wiring circuit layer through the wiring through hole.

In the method for manufacturing the OLED display screen integrated with the touch function in the present disclosure, the step of forming the first insulating ceramic layer on the glass substrate comprises steps of:

depositing a first insulating ceramic layer material on the glass substrate;

etching the first insulating ceramic layer material in the pixel region of the glass substrate to form the first insulating ceramic layer;

wherein the step of forming the first insulating organic layer in the pixel region of the glass substrate comprises steps of:

depositing a first insulating organic layer material on the pixel region of the glass substrate; and etching the first insulating organic layer material on the pixel region of the glass substrate to form the first insulating organic layer.

In the method for manufacturing the OLED display screen integrated with the touch function in the present disclosure, the steps of forming the touch insulating ceramic layer on the glass substrate and forming the wiring through hole in the wiring region of the glass substrate comprise steps of:

depositing a touch insulating ceramic layer material on the glass substrate; and etching the touch insulating ceramic layer material in the pixel region of the glass substrate to form the touch insulating ceramic layer; and etching the first insulating ceramic layer material and the touch insulating ceramic layer material in the wiring region of the glass substrate, to form the wiring through hole.

In the method for manufacturing the OLED display screen integrated with the touch function in the present disclosure, a dry etching is performed on the first insulating ceramic layer material and the touch insulating ceramic layer material, to form the wiring through hole.

In the method for manufacturing the OLED display screen integrated with the touch function in the present disclosure, after the step of forming the first insulating organic layer in the pixel region of the glass substrate, and before the step of forming the first touch electrode layer in the pixel region of the glass substrate, the method further comprising steps of:

forming a second insulating ceramic layer on the glass substrate; and forming a second insulating organic layer in the pixel region of the glass substrate.

In the method for manufacturing the OLED display screen integrated with the touch function in the present disclosure, the step of forming the first insulating ceramic layer on the glass substrate, comprises:

the step of forming the second insulating ceramic layer on the glass substrate, comprises steps of:

depositing a second insulating ceramic layer material on the glass substrate;

etching the second insulating ceramic layer material in the pixel region of the glass substrate to form the second insulating ceramic layer;

wherein the step of forming the second insulating organic layer in the pixel region of the glass substrate comprises steps of:

depositing a second insulating organic layer material in the pixel region of the glass substrate; and etching the second insulating organic layer material in the pixel region of the glass substrate, to form the second insulating organic layer.

In the method for manufacturing the OLED display screen integrated with the touch function in the present disclosure, the steps of forming the touch insulating ceramic layer on the glass substrate and forming the wiring through hole in the wiring region of the glass substrate comprise steps of:

depositing a touch insulating ceramic layer material on the glass substrate; and etching the touch insulating ceramic layer material in the pixel region of the glass substrate to form the touch insulating ceramic layer; and etching the first insulating ceramic layer material, the second insulating ceramic layer material and the touch insulating ceramic layer material in the wiring region of the glass substrate, to form the wiring through hole.

In the method for manufacturing the OLED display screen integrated with the touch function in the present disclosure, a dry etching is performed on the first insulating ceramic layer material, the second insulating ceramic layer material, and the touch insulating ceramic layer material, to form the wiring through hole.

In the method for manufacturing the OLED display screen integrated with the touch function in the present disclosure, the method for manufacturing the OLED display screen integrated with the touch function further comprises a step of:

forming a touch electrode protective layer on the second touch electrode layer.

In the method for manufacturing the OLED display screen integrated with the touch function in the present disclosure, the first touch electrode layer is a touch sensing layer, the second touch electrode layer is a touch driving layer, and the touch sensing layer and the touch driving layer are insulated against each other by the touch insulating ceramic layer.

In the method for manufacturing an OLED display screen integrated with the touch function in the present disclosure, simultaneously forming the touch insulating layer and the wiring through hole reduces the manufacturing cost of the OLED display screen integrated with the touch function, and simplifies the manufacturing process of the OLED display screen integrated with a touch function, thereby resolving the technical problems of the high manufacturing cost and the complicated manufacturing process of the conventional OLED display screen integrated with the touch function.

BRIEF DESCRIPTION OF THE DRAWINGS

In order to more clearly illustrate the embodiments of the present disclosure or the technical solutions in prior arts, the following briefly introduces the accompanying drawings used in the embodiments. Obviously, the drawings in the following description merely show some of the embodiments of the present disclosure. As regards one of ordinary skill in the art, other drawings can be obtained in accordance with these accompanying drawings without making creative efforts.

DETAILED DESCRIPTION OF THE PREFERRED EMBODIMENTS

The technical solution in the embodiments of the present disclosure is clearly and fully described as follows in with reference to the accompanying drawings in the embodiments of the present disclosure. Obviously, the described embodiments are merely part of the present disclosure, rather than all embodiments. Based on the embodiments in the present disclosure, all other embodiments obtained by a person of ordinary skill in the art without making creative work are within the scope of the present disclosure.

Figure 1:
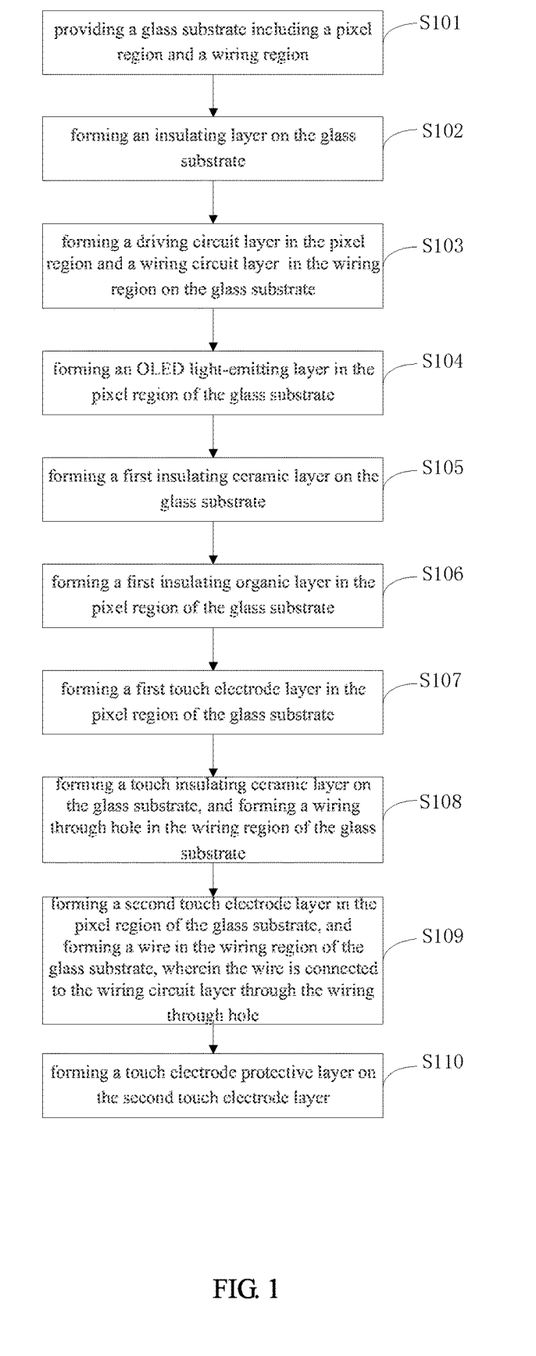
FIG. 1 is a flow chart of a method for manufacturing an OLED display screen integrated with a touch function in accordance with a first preferred embodiment of the present disclosure.
Figure 2:
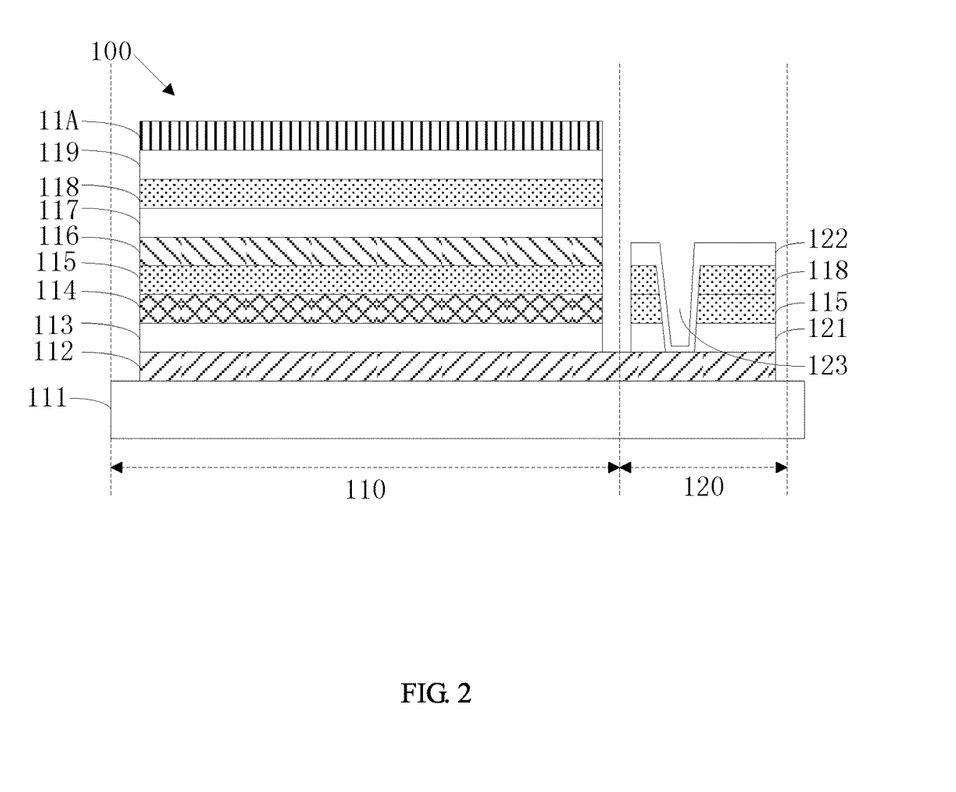
FIG. 2 is a schematic diagram of the OLED display screen integrated with the touch function corresponding to the method for manufacturing the OLED display screen integrated with the touch function in accordance with the first preferred embodiment of the present disclosure.

Refer to FIG. 1 and FIG. 2. FIG. 1 is a flow chart of a method for manufacturing an OLED display screen integrated with a touch function in accordance with a first preferred embodiment of the present disclosure. FIG. 2 is a schematic diagram of the OLED display screen integrated with the touch function corresponding to the method for manufacturing the OLED display screen integrated with the touch function in accordance with the first preferred embodiment of the present disclosure.

A method for manufacturing an OLED display screen integrated with a touch function in the present preferred embodiment includes steps of:

Step S101: providing a glass substrate 111 including a pixel region 110 and a wiring region 120;

Step S102: forming an insulating layer 112 on the glass substrate 111;

Step S103: forming a driving circuit layer 113 in the pixel region 110 and a wiring circuit layer 121 in the wiring region 120 on the glass substrate 111;

Step S104: forming an OLED light-emitting layer 114 in the pixel region 110 of the glass substrate 111;

Step S105: forming a first insulating ceramic layer 115 on the glass substrate 111;

Step S106: forming a first insulating organic layer 116 in the pixel region 110 of the glass substrate 111;

Step S107: forming a first touch electrode layer 117 in the pixel region 110 of the glass substrate 111;

Step S108: forming a touch insulating ceramic layer 118 on the glass substrate 111, and forming a wiring through hole 123 in the wiring region 120 of the glass substrate 111;

Step S109: forming a second touch electrode layer 119 in the pixel region 110 of the glass substrate 110, and forming a wire 122 in the wiring region 120 of the glass substrate 111, wherein the wire 122 is connected to the wiring circuit layer 121 through the wiring through hole 123; and Step S110: forming a touch electrode protective layer 11A on the second touch electrode layer 119.

Refer to FIG. 2, which describes the specific flow of each step of the method for manufacturing the OLED display screen 100 integrated with the touch function in the present preferred embodiment in detail.

In Step S101, a glass substrate 111 is provided, and the glass substrate 111 includes a pixel region 110 for disposing pixels and a wiring region 120 for disposing wires. Then, proceed to Step S102.

In Step S102, an insulating layer 112 is formed on the glass substrate 111 to avoid a short circuit between the driving circuit layer 113 and the wiring circuit layer 121. Then, proceed to Step S103.

In Step S103, a metal layer is deposited on the glass substrate 111, and the metal layer in the pixel region 110 of the glass substrate 111 is etched to form a driving circuit layer 113. The metal layer of the wiring region 120 of the glass substrate 111 is etched to form a wiring circuit layer 121. Then proceed to Step S104.

In Step S104, an OLED light-emitting layer 114 is formed in the pixel region 110 of the glass substrate 111. The OLED light-emitting layer 114 includes a cathode, an electron transport layer, a light emitting layer, a hole transport layer, and an anode to form a light emitting structure. Then proceed to Step S105.

In Step S105, the first insulating ceramic layer 115 is formed on the glass substrate 111. Specifically, the first insulating ceramic layer material is deposited on the glass substrate 111, and then the first insulating ceramic layer material in the pixel region 110 of the glass substrate 111 is etched to form the first insulating ceramic layer 115. Then proceed to step S106.

In Step S106, the first insulating organic layer 116 is formed on the glass substrate 111. Specifically, the first insulating organic layer material is deposited in the pixel region 110 of the glass substrate 111, and then the first insulating organic layer material in the pixel region 110 of the glass substrate 111 is etched to form the first insulating organic layer 116. Then proceed to step S107.

In Step S107, the first touch electrode layer 117 is formed in the pixel region 110 of the glass substrate 111. Specifically, the metal material of the touch electrode is deposited in the pixel region 110 of the glass substrate 111, and then the metal material of the touch electrode in the pixel substrate 110 of the glass substrate 111 is etched to form the first touch electrode layer 117, that is, the touch sensing layer. Then proceed to step S108.

In Step S108, a touch insulating ceramic layer 118 is formed on the glass substrate 111, and a wiring through hole 123 is formed in the wiring region 120 of the glass substrate 111. Specifically, the touch insulating ceramic layer material is deposited on the glass substrate 111. The touch insulating ceramic layer material in the pixel region 110 of the glass substrate 111 is then etched to form a touch insulating ceramic layer 118. A dry etching is performed simultaneously on the first insulating ceramic layer material and the touch insulating ceramic layer material in the wiring region 120 of the glass substrate 111, to form a wire through hole 123. Then, proceed to Step S109.

In Step S109, the second touch electrode layer 119 is formed in the pixel region 110 of the glass substrate 111, and the wire 122 is formed in the wiring region 120 of the glass substrate 111. Specifically, the metal material of the touch electrode is deposited on the glass substrate 111, and then the metal material of the touch electrode in the pixel substrate 110 of the glass substrate 111 is etched to form the second touch electrode layer 119, that is, the touch driving layer, while the metal material in the wiring region 120 of the glass substrate 111 is etched to form a wire 122, so that the wire 122 is connected to the wiring circuit layer 121 through the wiring through hole 123.

Since the stable connection between the wire 122 and the wiring circuit layer 121 is achieved without requiring any additional etching performed on the wiring region 120, the entire manufacturing process of the OLED display screen 100 is relatively simple. Then proceed to Step S110.

In Step S110, a touch electrode protective layer 11A is formed on the second touch electrode layer 119. The first touch electrode layer 117 and the second touch electrode layer 119 are prevented from being oxidized.

In this way, the manufacturing process of the method for manufacturing the OLED display screen 100 is integrated with the touch function in the present preferred embodiment.

In the method for manufacturing an OLED display screen integrated with the touch function in the present disclosure, simultaneously forming the touch insulating layer and the wiring through hole reduce the manufacturing cost of the OLED display screen integrated with the touch function, and simplify the manufacturing process of the OLED display screen integrated with the touch function.

Figure 3:
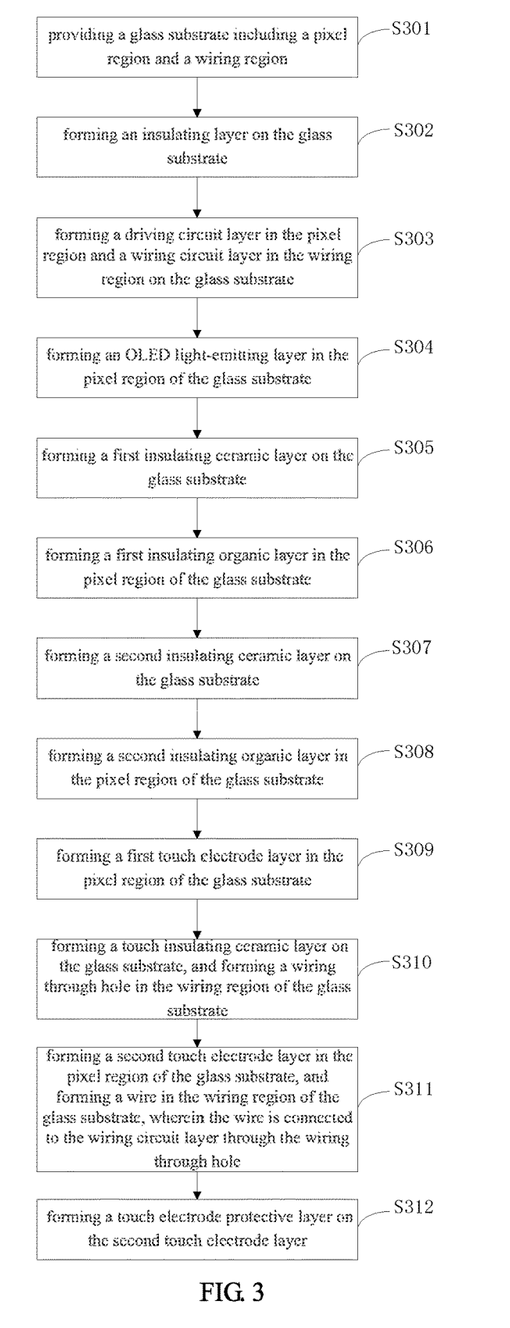
FIG. 3 is a flow chart of a method for manufacturing an OLED display screen integrated with a touch function in accordance with a second preferred embodiment of the present disclosure.
Figure 4:
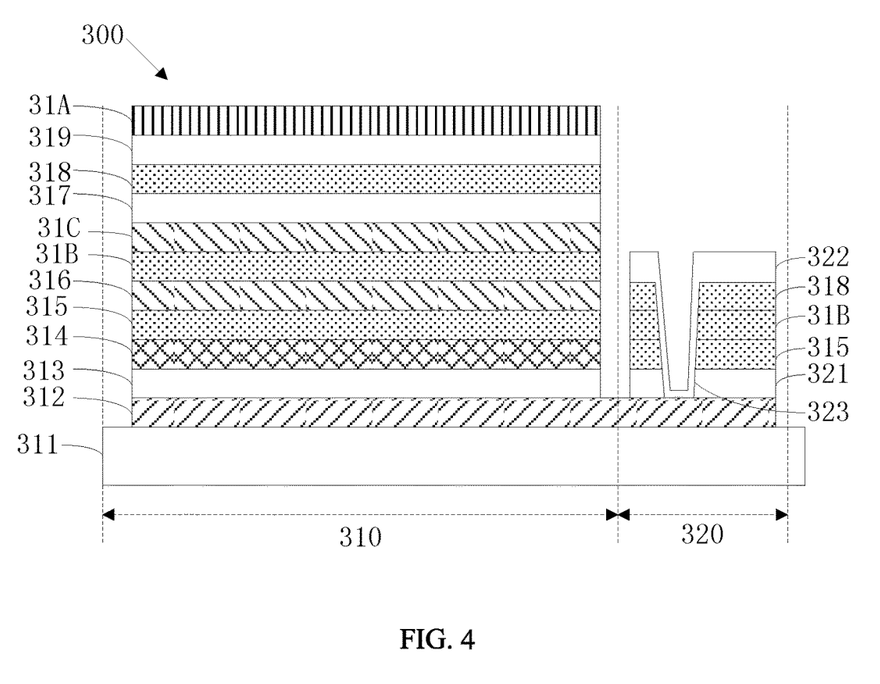
FIG. 4 is a schematic diagram of the OLED display screen integrated with the touch function corresponding to the method for manufacturing the OLED display screen integrated with the touch function in accordance with the second preferred embodiment of the present disclosure.

Refer to FIG. 3 and FIG. 4. FIG. 3 is a flow chart of a method for manufacturing an OLED display screen integrated with a touch function in accordance with a second preferred embodiment of the present disclosure. FIG. 4 is a schematic diagram of the OLED display screen integrated with the touch function corresponding to the method for manufacturing the OLED display screen integrated with the touch function in accordance with the second preferred embodiment of the present disclosure.

A method for manufacturing an OLED display screen 300 in the present preferred embodiment includes steps of:

Step S301: providing a glass substrate 311 including a pixel region 310 and a wiring region 120;

Step S302: forming an insulating layer 312 on the glass substrate 311;

Step S303: forming a driving circuit layer 313 in the pixel region 310 and a wiring circuit layer 321 in the wiring region 320 on the glass substrate 311;

Step S304: forming an OLED light-emitting layer 314 in the pixel region 310 of the glass substrate 311;

Step S305: forming a first insulating ceramic layer 315 on the glass substrate 311;

Step S306: forming a first insulating organic layer 316 in the pixel region 310 of the glass substrate 311;

In Step S307, forming a second insulating ceramic layer 31B on the glass substrate 311;

In Step S308, forming a second insulating organic layer 31C in the pixel region 310 of the glass substrate 311;

Step S309: forming a first touch electrode layer 317 in the pixel region 310 of the glass substrate 311;

Step S310: forming a touch insulating ceramic layer 318 on the glass substrate 311, and forming a wiring through hole 323 in the wiring region 320 of the glass substrate 311;

Step S311: forming a second touch electrode layer 319 in the pixel region 310 of the glass substrate 310, and forming a wire 322 in the wiring region 320 of the glass substrate 311, wherein the wire 322 is connected to the wiring circuit layer 321 through the wiring through hole 323; and Step S312: forming a touch electrode protective layer 31A on the second touch electrode layer 319.

Refer to FIG. 4, which describes the specific flow of each step of the method for manufacturing the OLED display screen 300 integrated with the touch function in the present preferred embodiment in detail.

Steps S301 to S306 are the same as or similar to those described in Steps S101 to S106 in the method for manufacturing the OLED display screen integrated the touch function in accordance with the first preferred embodiment of the present disclosure. Specifically, refer to the above related description in the method for manufacturing the OLED display screen with the touch function integrated in accordance with the first preferred embodiment.

In Step S307, the second insulating ceramic layer 31B is formed on the glass substrate 311. Specifically, the second insulating ceramic layer material is deposited on the glass substrate 311, and then the second insulating ceramic layer material in the pixel region 310 of the glass substrate 311 is etched to form the second insulating ceramic layer 31B. Then proceed to step S308.

In Step S308, the second insulating organic layer 31C is formed on the glass substrate 311. Specifically, the second insulating organic layer material is deposited in the pixel region 310 of the glass substrate 311, and then the second insulating organic layer material in the pixel region 310 of the glass substrate 311 is etched to form the first insulating organic layer 31C. Then proceed to step S309.

In Step S309, the first touch electrode layer 317 is formed in the pixel region 310 of the glass substrate 311. Specifically, the metal material of the touch electrode is deposited in the pixel region 310 of the glass substrate 311, and then the metal material of the touch electrode in the pixel substrate 310 of the glass substrate 111 is etched to form the first touch electrode layer 317, that is, the touch sensing layer. Then proceed to step S310.

In Step S310, a touch insulating ceramic layer 318 is formed on the glass substrate 311, and a wiring through hole 323 is formed in the wiring region 320 of the glass substrate 311. Specifically, the touch insulating ceramic layer material is deposited on the glass substrate 311. The touch insulating ceramic layer material in the pixel region 310 of the glass substrate 311 is then etched to form a touch insulating ceramic layer 318. A dry etching is performed simultaneously on the first insulating ceramic layer material, the second insulating layer material, and the touch insulating ceramic layer material in the wiring region 320 of the glass substrate 311, to form a wire through hole 323. Then, proceed to Step S311.

Steps S311 to S312 are the same as or similar to those described in Steps S109 to S110 in the method for manufacturing the OLED display screen integrated with the touch function in accordance with the first preferred embodiment of the present disclosure. Specifically, refer to the above related description in the method for manufacturing the OLED display screen with integrated touch function in accordance with the first preferred embodiment.

In this way, the manufacturing process of the method for manufacturing the OLED display screen integrated with the touch function in the present preferred embodiment is complete.

On the basis of the first preferred embodiment, the OLED display screen integrated with the touch function in the present preferred embodiment further enhances the waterproof and antioxidation of the LED display panel by forming a plurality of insulating ceramic layers and insulating organic layers.

In the method for manufacturing an OLED display screen with integrated touch function in the present disclosure, simultaneously forming the touch insulating layer and the wiring through hole reduces the manufacturing cost of the OLED display screen integrated with the touch function, and simplifies the manufacturing process of the OLED display screen integrated with the touch function, thereby resolving the technical problems of the high manufacturing cost and the complicated manufacturing process of the conventional OLED display screen integrated with the touch function.

In summary, although the preferable embodiments of the present disclosure have been disclosed above, the embodiments are not intended to limit the present disclosure. A person of ordinary skill in the art, without departing from the spirit and scope of the present disclosure, can make various modifications and variations. Therefore, the scope of the disclosure is defined in the claims.

What is claimed is:

1. A method for manufacturing an OLED display screen integrated with a touch function, comprising steps of:
    providing a glass substrate including a pixel region and a wiring region;
    forming an insulating layer on the glass substrate;
    forming a driving circuit layer on the insulating layer in the pixel region, and forming a wiring circuit layer on the insulating layer in the wiring region;
    forming an OLED light-emitting layer on the driving circuit layer in the pixel region;
    forming a first insulating ceramic layer on the OLED light-emitting layer in the pixel region, and forming the first insulating ceramic layer on the wiring circuit layer in the wiring region;
    forming a first insulating organic layer on the first insulating ceramic layer in the pixel region;
    forming a first touch electrode layer on the first insulating organic layer in the pixel region;
    forming a touch insulating ceramic layer on the first touch electrode layer in the pixel region, and forming the touch insulating ceramic layer on the first insulating ceramic layer in the wiring region, and forming a wiring through hole in the wiring region of the glass substrate;
    forming a second touch electrode layer on the touch insulating ceramic layer in the pixel region, and forming a wire in the wiring region of the glass substrate, wherein the wire is connected to the wiring circuit layer through the wiring through hole; and
    forming a touch electrode protective layer on the second touch electrode layer;
    wherein the first touch electrode layer is a touch sensing layer, the second touch electrode layer is a touch driving layer, and the touch sensing layer and the touch driving layer are insulated against each other by the touch insulating ceramic layer.

2. The method for manufacturing the OLED display screen integrated with the touch function as claimed in claim 1, wherein the step of forming the first insulating ceramic layer on the OLED light-emitting layer in the pixel region, and forming the first insulating ceramic layer on the wiring circuit layer in the wiring region comprises steps of:
    depositing a first insulating ceramic layer material on the OLED light-emitting layer in the pixel region, and depositing the first insulating ceramic layer material on the wiring circuit layer in the wiring region; and
    etching the first insulating ceramic layer material in the pixel region to form the first insulating ceramic layer; and
    wherein the step of forming the first insulating organic layer on the first insulating ceramic layer in the pixel region comprises steps of:
    depositing a first insulating organic layer material on the first insulating ceramic layer in the pixel region; and
    etching the first insulating organic layer material in the pixel region to form the first insulating organic layer.

3. The method for manufacturing the OLED display screen integrated with the touch function as claimed in claim 2, wherein the steps of forming the touch insulating ceramic layer on the first touch electrode layer in the pixel region, and forming the touch insulating ceramic layer on the first insulating ceramic layer in the wiring region, and forming the wiring through hole in the wiring region of the glass substrate comprise steps of
    depositing a touch insulating ceramic layer material on the first touch electrode layer in the pixel region, and depositing the touch insulating ceramic layer material on the first insulating ceramic layer in the wiring region; and
    etching the touch insulating ceramic layer material on the first touch electrode layer in the pixel region to form the touch insulating ceramic layer; and etching the first insulating ceramic layer material and the touch insulating ceramic layer material in the wiring region to form the wiring through hole.

4. The method for manufacturing the OLED display screen integrated with the touch function as claimed in claim 3, wherein a dry etching is performed on the first insulating ceramic layer material and the touch insulating ceramic layer material, to form the wiring through hole.

5. The method for manufacturing the OLED display screen integrated with the touch function as claimed in claim 1, after the step of forming the first insulating organic layer on the first insulating ceramic layer in the pixel region, and before the step of forming the first touch electrode layer on the first insulating organic layer in the pixel region, further comprising steps of:
    forming a second insulating ceramic layer on the first insulating organic layer in the pixel region, and forming the second insulating ceramic layer on the first insulating ceramic layer in the wiring region; and forming a second insulating organic layer on the second insulating ceramic layer in the pixel region.

6. The method for manufacturing the OLED display screen integrated with the touch function as claimed in claim 5, wherein
the step of forming the second insulating ceramic layer on the first insulating organic layer in the pixel region, and forming the second insulating ceramic layer on the first insulating ceramic layer in the wiring region, comprises steps of:
depositing a second insulating ceramic layer material on the first insulating organic layer in the pixel region, and depositing the second insulating ceramic layer material on the first insulating ceramic layer in the wiring region; and
etching the second insulating ceramic layer material on the first insulating organic layer in the pixel region, and etching the second insulating ceramic layer material on the first insulating ceramic layer in the wiring region to form the second insulating ceramic layer; and
wherein the step of forming the second insulating organic layer on the second insulating ceramic layer in the pixel region comprises steps of:
depositing a second insulating organic layer material on the second insulating ceramic layer in the pixel region; and
etching the second insulating organic layer material on the second insulating ceramic layer in the pixel region, to form the second insulating organic layer.

7. The method for manufacturing the OLED display screen integrated with the touch function as claimed in claim 6, wherein the steps of forming the touch insulating ceramic layer on the first touch electrode layer in the pixel region, and forming the touch insulating ceramic layer on the first insulating ceramic layer in the wiring region, and forming the wiring through hole in the wiring region of the glass substrate comprise steps of
depositing a touch insulating ceramic layer material on the first touch electrode layer in the pixel region, and depositing the touch insulating ceramic layer material on the first insulating ceramic layer in the wiring region; and
etching the touch insulating ceramic layer material in the pixel region to form the touch insulating ceramic layer; and etching the first insulating ceramic layer material, the second insulating ceramic layer material and the touch insulating ceramic layer material in the wiring region, to form the wiring through hole.

8. The method for manufacturing the OLED display screen integrated with the touch function as claimed in claim 7, wherein a dry etching is performed on the first insulating ceramic layer material, the second insulating ceramic layer material, and the touch insulating ceramic layer material, to form the wiring through hole.

9. A method for manufacturing an OLED display screen integrated with a touch function, comprising steps of:
providing a glass substrate including a pixel region and a wiring region;
forming an insulating layer on the glass substrate;
forming a driving circuit layer on the insulating layer in the pixel region, and forming a wiring circuit layer on the insulating layer in the wiring region;
forming an OLED light-emitting layer on the driving circuit layer in the pixel region;
forming a first insulating ceramic layer on the OLED light-emitting layer in the pixel region, and forming the first insulating ceramic layer in the wiring region;
forming a first insulating organic layer on the first insulating ceramic layer in the pixel region;
forming a first touch electrode layer on the first insulating organic layer in the pixel region;
forming a touch insulating ceramic layer on the first touch elects fide layer in the pixel region, and forming the touch insulating ceramic layer on the first insulating ceramic layer in the wiring region, and forming a wiring through hole in the wiring region of the glass substrate;
forming a second touch electrode layer on the touch insulating ceramic layer in the pixel region, and forming a wire in the wiring region of the glass substrate, wherein the wire is connected to the wiring circuit layer through the wiring through hole.

10. The method for manufacturing the OLED display screen integrated with the touch function as claimed in claim 9, wherein the step of forming the first insulating ceramic layer on the OLED light-emitting layer in the pixel region, and forming the first insulating ceramic layer on the wiring circuit layer in the wiring region comprises steps of:
depositing a first insulating ceramic layer material on the OLED light-emitting layer in the pixel region, and depositing the first insulating ceramic layer material on the wiring circuit layer in the wiring region; and
etching the first insulating ceramic layer material in the pixel region form the first insulating ceramic layer; and
wherein the step of forming the first insulating organic layer on the first insulating ceramic layer in the pixel region comprises steps of:
depositing a first insulating organic layer material on the first insulating ceramic layer in the pixel region; and
etching the first insulating organic layer material in the pixel region to form the first insulating organic layer.

11. The method for manufacturing the OLED display screen integrated with the touch function as claimed in claim 10, wherein the steps of forming the touch insulating ceramic layer on the first touch electrode layer in the pixel region, and forming the touch insulating ceramic layer on the first insulating ceramic layer in the wiring region, and forming the wiring through hole in the wiring region of the glass substrate comprise steps of:
depositing a touch insulating ceramic layer material on the first touch electrode layer in the pixel region, and depositing the touch insulating ceramic layer material on the first insulating ceramic layer in the wiring region; and
etching the touch insulating ceramic layer material on the first touch electrode layer in the pixel region to form the touch insulating ceramic layer; and etching the first insulating ceramic layer material and the touch insulating ceramic layer material in the wiring region, to form the wiring through hole.

12. The method for manufacturing the OLED display screen integrated with the touch function as claimed in claim 11, wherein a dry etching is performed on the first insulating ceramic layer material and the touch insulating ceramic layer material, to form the wiring through hole.

13. The method for manufacturing the OLED display screen integrated with the touch function as claimed in claim 9, after the step of forming the first insulating organic layer on the first insulating ceramic layer in the pixel region, and before the step of forming the first touch electrode layer on the first insulating organic layer in the pixel region, further comprising steps of:
forming a second insulating ceramic layer on the first insulating organic layer in the pixel region, and forming, the second insulating ceramic layer on the first insulating ceramic layer in the wiring region; and forming a second insulating organic layer on the second insulating ceramic layer in the pixel region.

14. The method for manufacturing the OLED display screen integrated with the touch function as claimed in claim 13, wherein the step of forming the second insulating ceramic layer on the first insulating organic layer in the pixel region, and forming the second insulating ceramic layer on the first insulating ceramic layer in the wiring region, comprises steps of:

depositing a second insulating ceramic layer material on the first insulating organic layer in the pixel region, and depositing the second insulating ceramic layer material on the first insulating ceramic layer in the wiring region; and etching the second insulating ceramic layer material on the first insulating organic layer in the pixel region and etching the second insulating ceramic layer material on the first insulating ceramic layer in the wiring region to form the second insulating ceramic layer; and wherein the step of forming a second insulating organic layer on the second insulating ceramic layer in the pixel region comprises steps of:

depositing a second insulating organic layer material on the second insulating ceramic layer in the pixel region; and etching the second insulating organic layer material on the second insulating ceramic layer in the pixel region, to form the second insulating organic layer.

15. The method for manufacturing the OLED display screen integrated with the touch function as claimed in claim 14, wherein the steps of forming the touch insulating ceramic layer on the first touch electrode layer in the pixel region, and forming the touch insulating ceramic layer on the first insulating ceramic layer in the wiring region, and forming the wiring through hole in the wiring region of the glass substrate comprise steps of:

depositing a touch insulating ceramic layer material on the first touch electrode layer in the pixel region, and depositing the touch insulating ceramic layer material on the first insulating ceramic layer in the wiring region; and etching the touch insulating ceramic layer material in the pixel region to form the touch insulating ceramic layer; and etching the first insulating ceramic layer material, the second insulating ceramic layer material and the touch insulating ceramic layer material in the wiring region, to form the wiring through hole.

16. The method for manufacturing the OLED display screen integrated with the touch function as claimed in claim 15, wherein a dry etching is performed on the first insulating ceramic layer material, the second insulating ceramic layer material, and the touch insulating ceramic layer material, to form the wiring through hole.

17. The method for manufacturing the OLED display screen integrated with the touch function as claimed in claim 9, further comprising a step of:

forming a touch electrode protective layer on the second touch electrode layer.

18. The method for manufacturing the OLED display screen integrated with the touch function as claimed in claim 9, wherein the first touch electrode layer is a touch sensing layer, the second touch electrode layer is a touch driving layer, and the touch sensing layer and the touch driving layer are insulated against each other by the touch insulating ceramic layer.

\* \* \* \* \*